(12) United States Patent
Jung (10) Patent No.: US 7,129,463 B2
(45) Date of Patent: Oct. 31, 2006

(54) PHOTOCURRENT SENSING CIRCUIT HAVING STABILIZED FEEDBACK LOOP

(75) Inventor: Deok-Young Jung, Yongin (KR)

(73) Assignee: Atlab Inc. (KR)

( * ) Notice: Subject to any disclaimer, the term of this patent is extended or adjusted under 35 U.S.C. 154(b) by 0 days.

(21) Appl. No.: 10/968,535

(22) Filed: Oct. 19, 2004

(65) Prior Publication Data
US 2005/0116146 A1    Jun. 2, 2005

(30) Foreign Application Priority Data
Oct. 20, 2003    (KR) ...................... 10-2003-0073199

(51) Int. Cl.
*H03F 3/08*    (2006.01)
(52) U.S. Cl. ............................ 250/214 R; 250/214 LS
(58) Field of Classification Search ............ 250/214 R, 250/214 LS, 208.1
See application file for complete search history.

(56) References Cited
U.S. PATENT DOCUMENTS
6,104,020 A * 8/2000 Knee et al. ............. 250/214 R
6,593,560 B1 * 7/2003 Misek .................... 250/214 R

* cited by examiner

Primary Examiner—Georgia Epps
Assistant Examiner—Tony Lu
(74) Attorney, Agent, or Firm—Cantor Colburn LLP (57) ABSTRACT

A photocurrent sensing circuit having a stabilized feedback loop comprises a photocurrent generator including a photodiode generating the photocurrent in proportion to an amount of incident light and applying the photocurrent to an output node, a switching unit applying the photocurrent applied to a control node to a voltage-generating capacitor when a shutter signal is in a first state, and applying a predetermined current to the control node when the shutter signal is in a second state, and a circuit stabilizer applying the photocurrent applied to the output node to the control node, and always forming a feedback loop of the photodiode through the photocurrent applied to the output node, wherein the circuit stabilizer comprises a first NMOS transistor forming the feedback loop of the photodiode in response to the photocurrent input to the output node when the predetermined current is applied to the control node, breaking the feedback loop and applying the photocurrent applied to the output node to the control node when the predetermined current is not applied to the control node, a second NMOS transistor always forming the feedback loop of the photodiode in response to the photocurrent applied to the output node, and a third NMOS transistor connected to the first and second transistors and the photodiode, and providing a current path for forming the feedback loop.

5 Claims, 7 Drawing Sheets

PHOTOCURRENT SENSING CIRCUIT HAVING STABILIZED FEEDBACK LOOP

CROSS-REFERENCE TO RELATED APPLICATION

This application claims the benefit of Korean Patent Application No. 2003-73199, filed Oct. 24, 2003, the disclosure of which is hereby incorporated herein by reference in its entirety.

BACKGROUND OF THE INVENTION

1. Field of the Invention

The present invention relates to a photocurrent sensing circuit and, more particularly, to a photocurrent sensing circuit having a stabilized feedback loop that converts a light signal into an electrical signal.

2. Description of the Related Art

A circuit presented in U.S. Pat. No. 6,104,020 is illustrated in FIG. 1 as the prior art.

Figure 1:
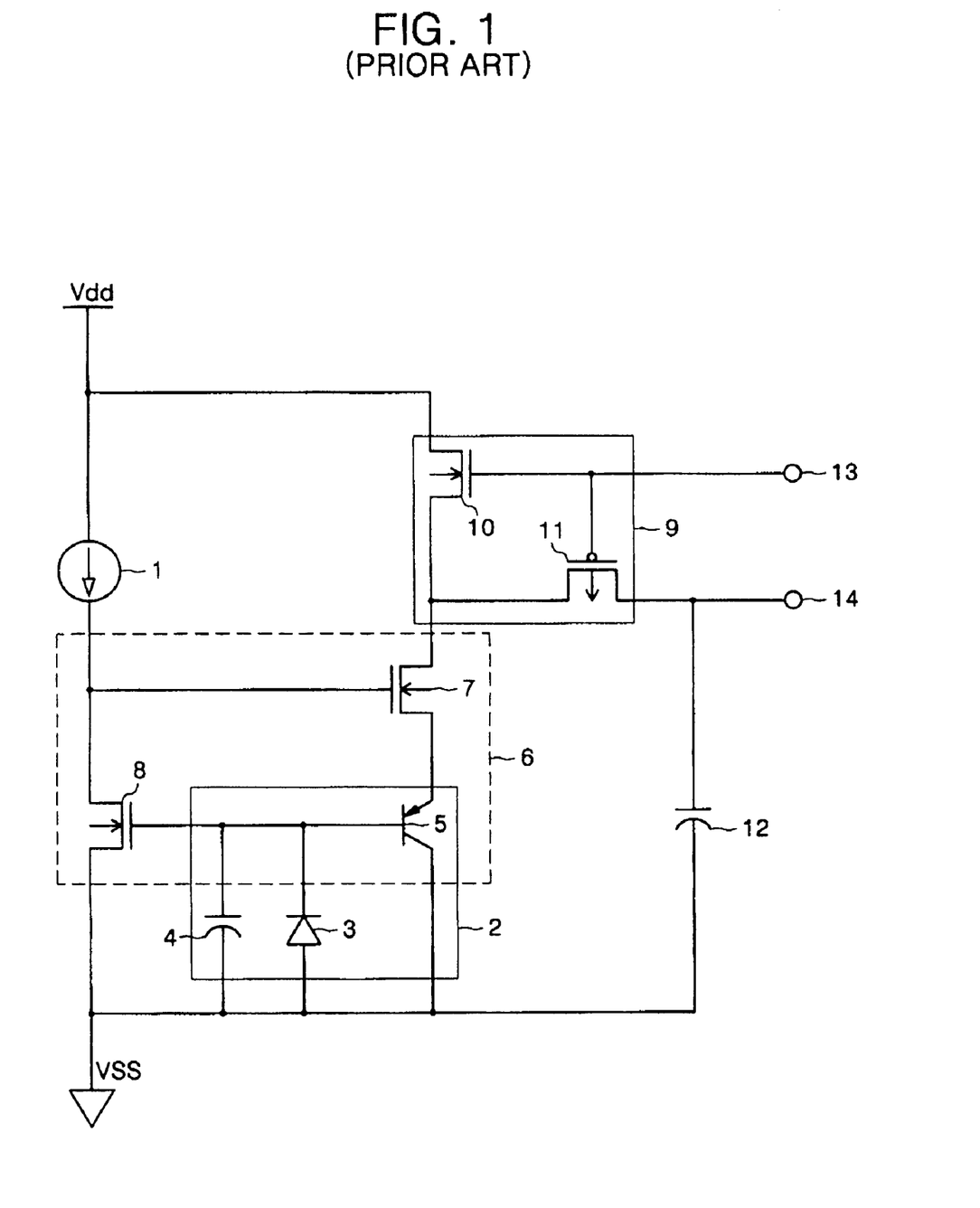
FIG. 1 is a diagram showing a photocurrent sensing circuit according to the prior art.

Referring to FIG. 1, the conventional photocurrent sensing circuit includes a current source 1 that applies a driving current of a photocurrent sensing circuit; a photocurrent generating unit that generates and amplifies a photocurrent in response to the amount of light incident into the photocurrent sensing circuit; a feedback loop that stabilizes an operating voltage of the photocurrent generating unit 2; a voltage signal output unit 12 that outputs a voltage signal proportional to the photocurrent generated by the photocurrent generating unit 2; and a switching unit 9 that steers the photocurrent of the photocurrent generating unit 2 toward the voltage signal output unit 12 or power voltage Vdd depending on a status of an output control signal 13. The photocurrent generating unit 2 includes a photodiode 3 that generates the photocurrent in response to the amount of light incident into the photocurrent sensing circuit; a parasitic capacitor 4 of the photodiode 3; and a PNP transistor 5 that amplifies the photocurrent generated by the photodiode 3.

The feedback loop 6 includes an NMOS transistor 7 where a drain node is connected to an NMOS transistor 10 of the switching unit 9, a source node is connected to the PNP transistor 5 of the photocurrent generating unit 2, and a gate node is connected to the current source 1 to provide a feedback loop generation current in response to operation of the NMOS transistor 10 of the switching unit 9; an NMOS transistor 8 where a drain node is connected to the current source 1, a gate node is connected to a cathode node of the photodiode, and a source node is connected to an anode node 3 of the photodiode of the photocurrent generating unit 2 to provide the feedback loop generation current in response to the current source 1; and the PNP transistor 5 of the photocurrent generating unit 2.

The switching unit 9 includes an NMOS transistor 10 where a gate node is connected to an output control terminal 13, a drain node is connected to a power voltage Vdd, and a source node is connected to the feedback loop 6 to control a current supply of the drain node of the NMOS transistor 7 in response to an output signal of the output control terminal 13; and an PMOS transistor 11 where a gate node is connected to the output control terminal 13, a drain node is connected to a storage capacitor 12, and a source node is connected to the feedback loop 6 to switch the photocurrent delivered through the NMOS transistor 7 into the voltage signal output unit 12 in response to the output signal of the output control terminal 13.

The voltage signal output unit 12 includes the storage capacitor 12 that generates a voltage signal proportional to the photocurrent generated by the photocurrent generating unit 2.

Operation of the photocurrent sensing circuit of FIG. 1 described above is as follows.

When the light is illuminated into the photodiode 3, a photocurrent is generated proportional to the amount of light. The photocurrent flows as a base current of the PNP transistor 5 as long as a voltage of a base node of the PNP transistor 5 remains constant through the feedback loop 6. As such, when the photocurrent flows as the base current of the PNP transistor 5, a current amplified by a current amplification factor, i.e., a gain of the PNP transistor 5 flows in the NMOS transistor 7.

The current delivered through the NMOS transistor 7 is switched depending on the status of the output control signal of the output control terminal 13 to be output as a voltage signal of the storage capacitor 12 or driven into the feedback loop circuit to keep constant the base voltage of the PNP transistor 5. First, when an output control signal having a Shutter On value is applied to the switching unit 9 from the output control terminal 13, the PMOS transistor 11 of the switching unit 9 turns on and the NMOS transistor 10 of the switching unit 9 turns off in response to the output control signal.

Therefore, the current delivered through the NMOS transistor 7 allows charges stored in the storage capacitor 12 of the voltage signal output unit 12 to be discharged.

Thus, a current proportional to the discharged amount of charges is generated in the voltage signal output unit 12, and a voltage signal is generated proportional to the generated current. Further, the generated voltage signal is outputted via the output terminal 14.

On the contrary, when an output control signal having a Shutter Off value is applied from the output control terminal 13 to the switching unit 9, in the switching unit 9, the NMOS transistor 10 turns on and the PMOS transistor 11 turns off in response to the output control signal, i.e. the Shutter Off.

When the storage capacitor 12 does not discharge the charges, the current delivered through the NMOS transistor 10 serves to provide a current path that keeps stable the feedback loop having the NMOS transistors 7, 8 and the PNP transistor 5.

A good photocurrent sensing circuit requires high efficiency in converting light into a voltage, a wide operating range in both dark and bright environment, a high signal-to-noise ratio (SNR) and fast response characteristics.

In the prior art shown of FIG. 1, the feedback loop formed by coupling between the NMOS transistors 7, 8 and the PNP transistor 5 forms a stable circuit, thereby having high efficiency, a wide operating range and a high SNR.

However, much attention should be paid to keeping the feedback loop stable. This is because the NMOS transistor 7 and the PMOS transistor 11 may simultaneously turn off to make the feedback loop temporarily unstable if the timing is not maintained in driving the output control signal as an ideal pulse signal of the output control terminal 13. During transition time of the output control terminal 13, both NMOS transistor 10 and PMOS transistor 11 turn off. Further, when the overall photocurrent sensing circuit is driven using the output control signal, if the amount of light incident into a specific photocurrent sensing circuit is large, the amplitude of the photocurrent generated through the photocurrent generating unit 2 of the photocurrent sensing circuit becomes larger proportional to the amount of incident light, and accordingly the voltage of the storage capacitor 12 is rapidly lowered.

In this case, the voltage of an emitter node of the PNP transistor 5 is lowered, so that the PNP transistor 5 turns off and the feedback loop is not maintained normally, causing each node voltage of the feedback loop to be unstable.

Such an unstable feedback loop also leads to the unstable voltage of the base node of the PNP transistor 5, which degrades the overall photocurrent conversion characteristics of the photocurrent sensing circuit.

Further, while the PNP transistor 5 has an advantage that a current generated by light is amplified, the current amplification factor of the PNP transistor 5 is not uniform among pixels due to a process variation, so that it exerts a bad influence on the overall uniformity of the photocurrent sensing circuit.

SUMMARY OF THE INVENTION

It is, therefore, an object of the present invention to provide a photocurrent sensing circuit having a stabilized feedback loop that continuously keeps a feedback loop stable and provides fast response properties and a wide operating range such that photocurrent conversion is rapidly performed to increase the conversion speed of the optical signal.

According to an aspect of the present invention, a photocurrent sensing circuit having a stabilized feedback loop comprises a photocurrent generator including a photodiode generating the photocurrent in proportion to an amount of incident light and applying the photocurrent to an output node, a switching unit applying the photocurrent applied to a control node to a voltage-generating capacitor when a shutter signal is in a first state, and applying a predetermined current to the control node when the shutter signal is in a second state, and a circuit stabilizer applying the photocurrent applied to the output node to the control node, and always forming a feedback loop of the photodiode through the photocurrent applied to the output node, wherein the circuit stabilizer comprises a first NMOS transistor forming the feedback loop of the photodiode in response to the photocurrent input to the output node when the predetermined current is applied to the control node, breaking the feedback loop and applying the photocurrent applied to the output node to the control node when the predetermined current is not applied to the control node, a second NMOS transistor always forming the feedback loop of the photodiode in response to the photocurrent applied to the output node, and a third NMOS transistor connected to the first and second transistors and the photodiode, and providing a current path for forming the feedback loop.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

A photocurrent sensing circuit having a stabilized feedback loop of the present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 2:
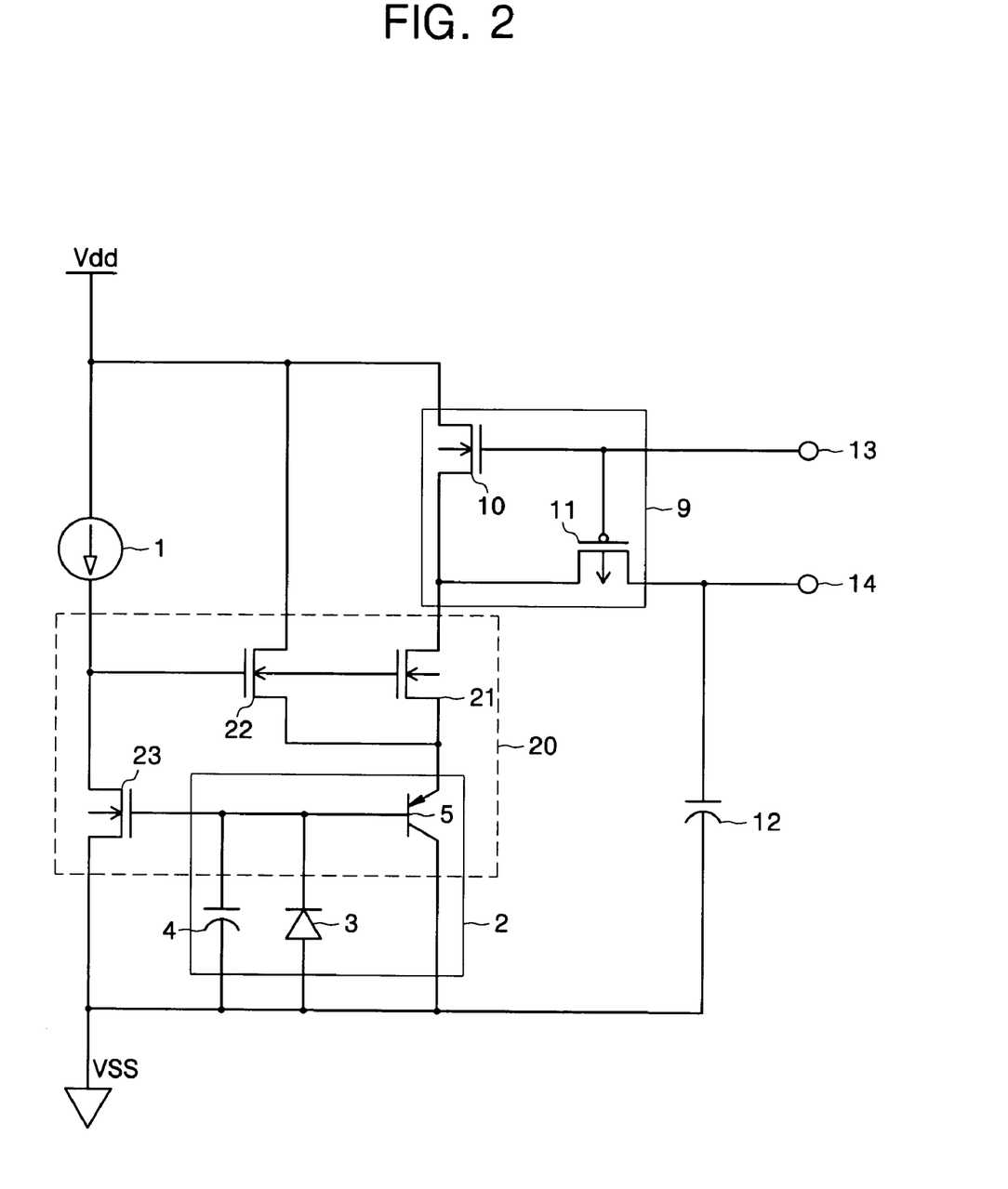
FIG. 2 is a diagram showing a photocurrent sensing circuit having a stabilized feedback loop according to a first embodiment of the present invention.

FIG. 2 is a diagram showing a photocurrent sensing circuit having a stabilized feedback loop according to a first embodiment of the present invention.

The photocurrent sensing circuit of FIG. 2 ensures continuous stability of a feedback loop by adding an NMOS transistor 22 to the feedback loop 6 of the photocurrent sensing circuit of FIG. 1. Therefore, like numbers refer to like elements for a circuit that has the same configuration and operation as in FIG. 1 so that the detailed description thereof will be omitted.

Still referring to FIG. 2, a feedback loop 20 of the photocurrent sensing circuit of the present invention further includes an NMOS transistor 22 where a drain node is connected to a power voltage, a gate node is connected to a current source 1, and a source node is connected to a PNP transistor 5. In the feedback loop 20, if both an NMOS transistor 10 and a PMOS transistor 11 turn off at the same time during a period that an output control signal transmitted from an output control terminal 13 transitions from Shutter On to Shutter Off (or from Shutter Off to Shutter On), an NMOS transistor 21 also turns off. However, the NMOS transistor 22 added to the feedback loop of the photocurrent sensing circuit of the present invention always makes the feedback loop stable because its drain node is directly connected to the power voltage Vdd and its source node is directly connected to the PNP transistor 5.

In other words, when the NMOS transistor 21 turns off, the NMOS transistor 22 acts on behalf of the NMOS transistor 21 to make stable the feedback loop 20 that includes the NMOS transistors 22, 23 and the PNP transistor 5.

The photocurrent sensing circuit of FIG. 2 as described above makes up for the weak points of the feedback loop 6 in the photocurrent sensing circuit of the prior art shown in FIG. 1 to provide a more stable feedback loop 20.

Figure 3:
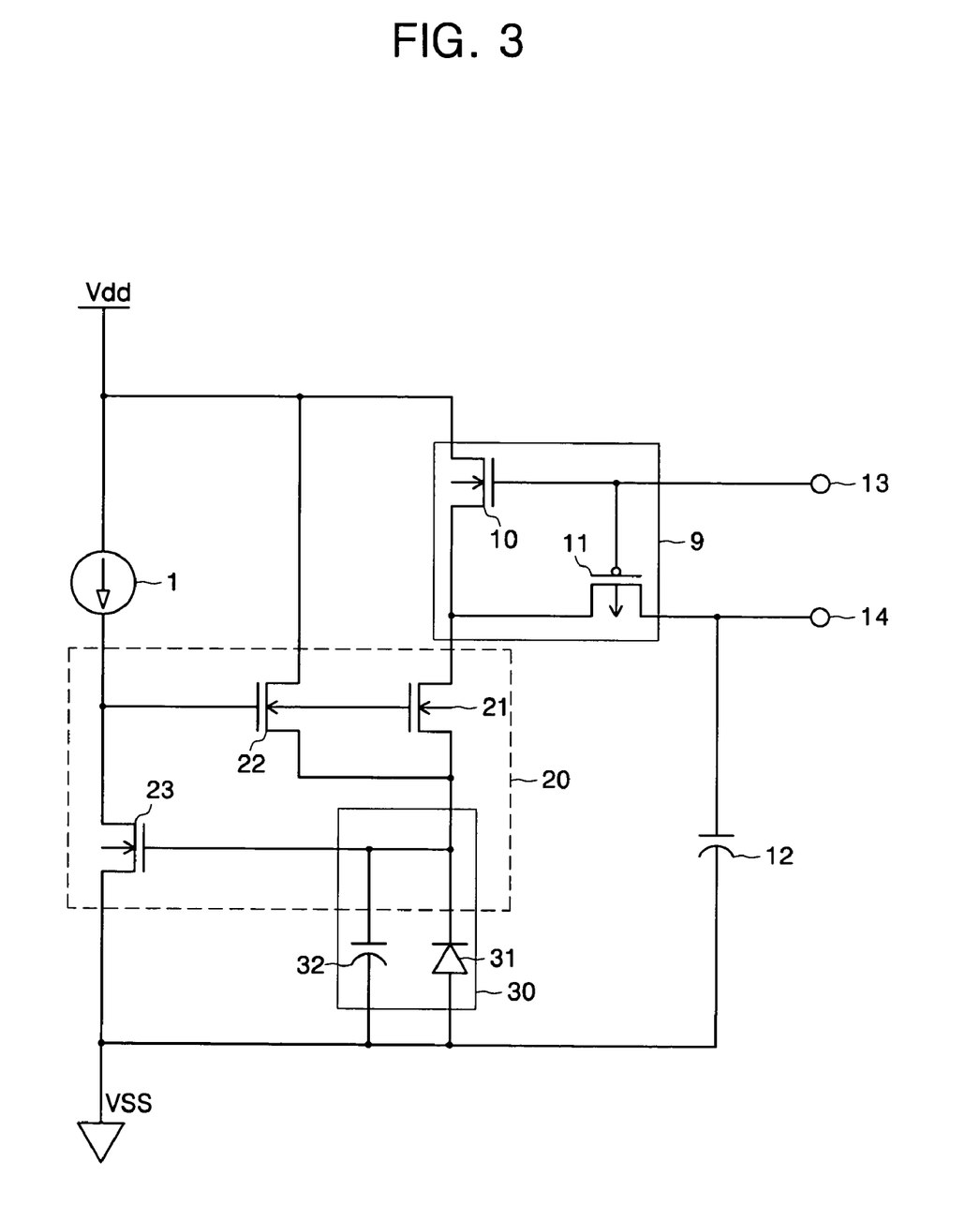
FIG. 3 is a diagram showing a photocurrent sensing circuit having a stabilized feedback loop according to a second embodiment of the present invention.

FIG. 3 is a diagram showing a photocurrent sensing circuit having a stabilized feedback loop according to a second embodiment of the present invention.

The photocurrent sensing circuit of FIG. 3 is an example of a circuit that has a wider operating voltage range and improved uniformity of the photocurrent sensing circuit together with the stabilized feedback loop 20 of FIG. 2.

Like numbers refer to like elements for a circuit that has the same configuration and operation as in FIG. 2 so that the detailed description thereof will be omitted.

Still referring to FIG. 3, a photocurrent generating unit 30 of the photocurrent sensing circuit of the present invention includes a photodiode 31 that generates a photocurrent in response to the amount of light incident into an optical sensor; and a parasitic capacitor 32 of the photodiode.

Here, the photocurrent generated in the photodiode 31 is directly delivered to an NMOS transistor 21, and the photocurrent delivered through the NMOS transistor 21 is switched to a feedback loop 20 or a voltage signal output unit 12 depending on operation of a switching unit 9.

The photocurrent sensing circuit of FIG. 3 as described above removes the PNP transistor 5 of the photocurrent generating unit 2 of FIG. 2, so that the operating voltage of the storage capacitor 12 is lowered as much as a forward "turn-on" voltage of an emitter-base diode of the PNP transistor 5. Accordingly, the operating voltage range of the photocurrent sensing circuit becomes wider.

Further, advantageously, the degradation of uniformity due to a process variation of the current amplification factor of the PNP transistor 5, i.e., a fixed pattern noise is lowered by removing the PNP transistor 5.

Figure 4:
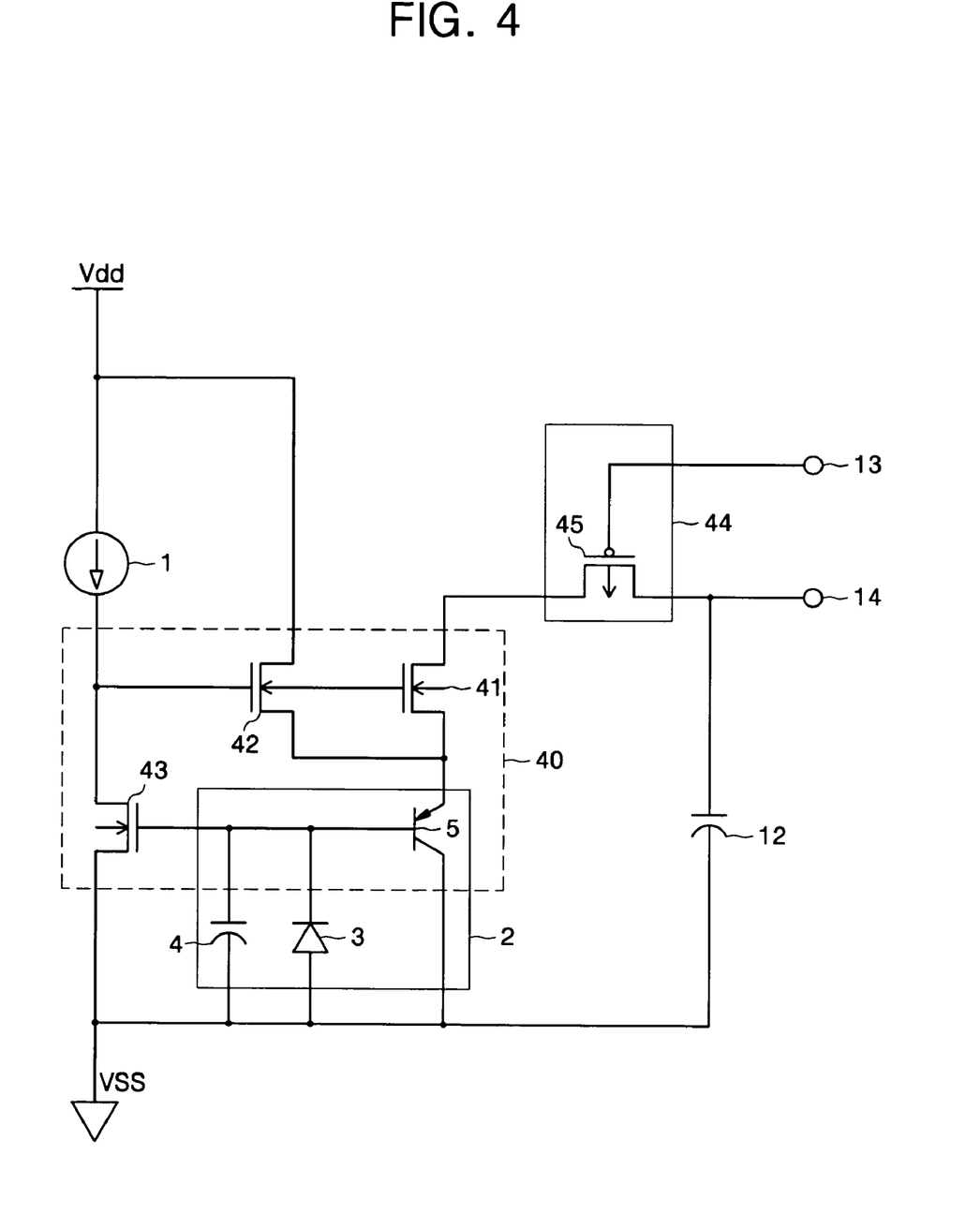
FIG. 4 is a diagram showing a photocurrent sensing circuit having a stabilized feedback loop according to a third embodiment of the present invention.

FIG. 4 is a diagram showing a photocurrent sensing circuit having a stabilized feedback loop according to a third embodiment of the present invention.

The photocurrent sensing circuit of FIG. 4 is an example of a circuit that has a simpler configuration of the photocurrent sensing circuit together with the stabilized feedback loop 20 of FIG. 2.

Like numbers refer to like elements for a circuit that has the same configuration and operation as in FIG. 2 so that the detailed description thereof will be omitted.

Still referring to FIG. 4, a switching unit 44 of the photocurrent sensing circuit of the present invention includes a PMOS transistor 45 that turns on when an output control signal of the switching unit 44 is Shutter On, and turns off when the output control signal is Shutter Off.

Therefore, a feedback loop 40 is continuously maintained irrespective of operation of the switching unit 44 of the photocurrent sensing circuit, to keep constant a base voltage of a PNP transistor 5.

The photocurrent sensing circuit of FIG. 4 as described above removes the NMOS transistor 10 of the switching unit 9 of FIG. 2, so that a simpler photocurrent sensing circuit is implemented, and also the feedback loop 40 is separated with the switching unit 44 that transmits the output control signal to make the feedback loop 40 not affected by the output control signal of the output control terminal 13.

Figure 5:
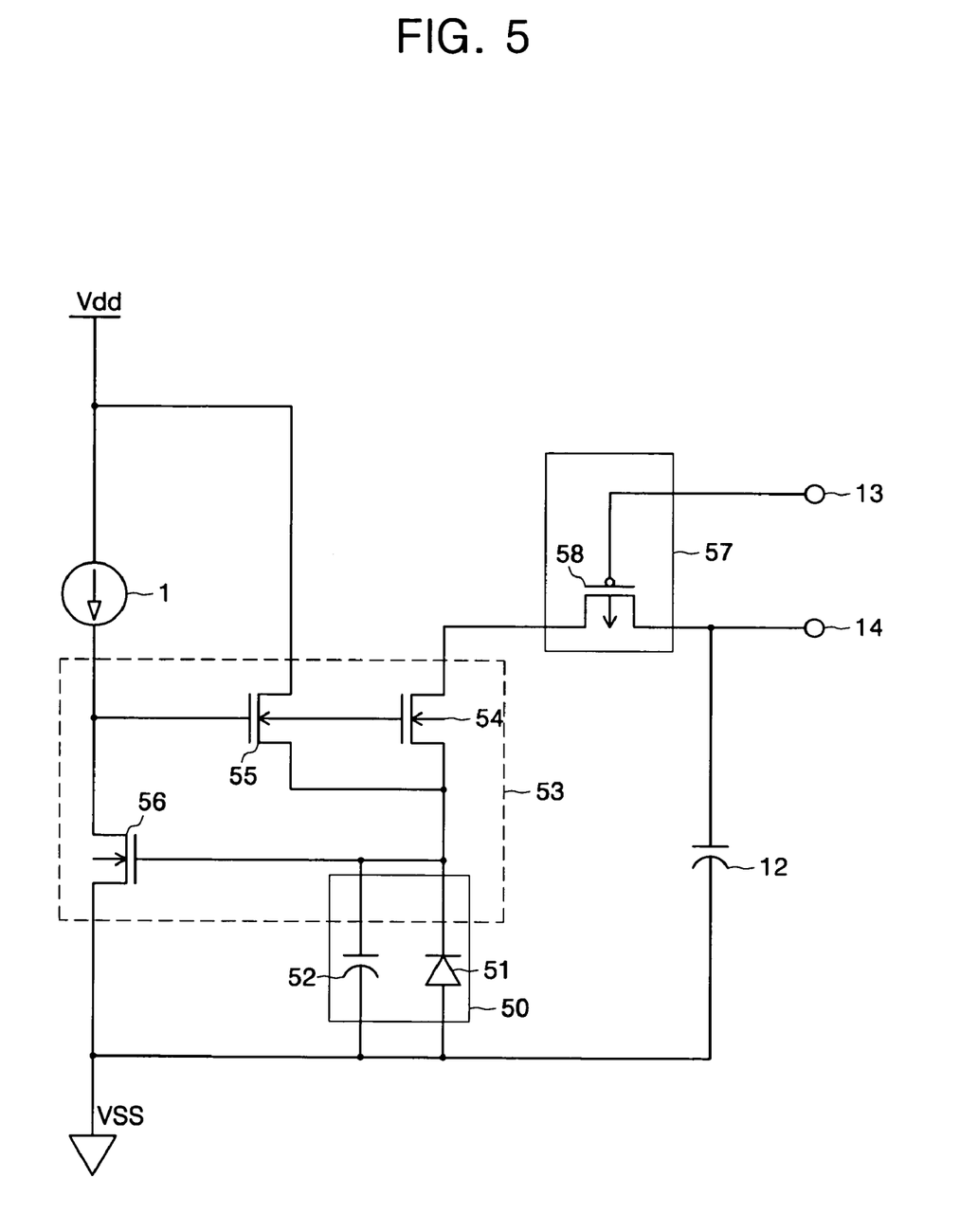
FIG. 5 is a diagram showing a photocurrent sensing circuit having a stabilized feedback loop according to a fourth embodiment of the present invention.

FIG. 5 is a diagram showing a photocurrent sensing circuit having a stabilized feedback loop according to a fourth embodiment of the present invention.

The photocurrent sensing circuit of FIG. 5, which applies the photocurrent sensing circuits of FIGS. 2, 3 and 4, is an example of a circuit that has a stabilized feedback loop, a simpler circuit configuration, a wider operating voltage range and improved uniformity of the photocurrent sensing circuit.

Like numbers refer to like elements for a circuit that has the same configuration and operation as in FIG. 2 so that the detailed description thereof will be omitted.

Still referring to FIG. 5, a photocurrent generating unit 50 has a photodiode 51, and a parasitic capacitor 52 of the photodiode 51, and a switching unit 57 includes a PMOS transistor 58 that turns on when an output control signal is Shutter On, and turns of when the output control signal is Shutter Off.

The photocurrent sensing circuit of FIG. 5 as described above removes the NMOS transistor 10 of the switching unit 9 of FIG. 2, so that a simpler photocurrent sensing circuit is implemented, and also a feedback loop 53 is separated with the output control terminal 13 that transmits the output control signal to make the feedback loop 53 not affected by the output control signal of the output control terminal 13.

Further, by removing the PNP transistor 5 of the photocurrent generating unit 2 shown in FIG. 2, an operating voltage of the photocurrent sensing circuit becomes wider, and moreover, the degradation of uniformity due to a process variation of the current amplification factor of the PNP transistor 5, i.e., a fixed pattern noise may be lowered.

Figure 6:
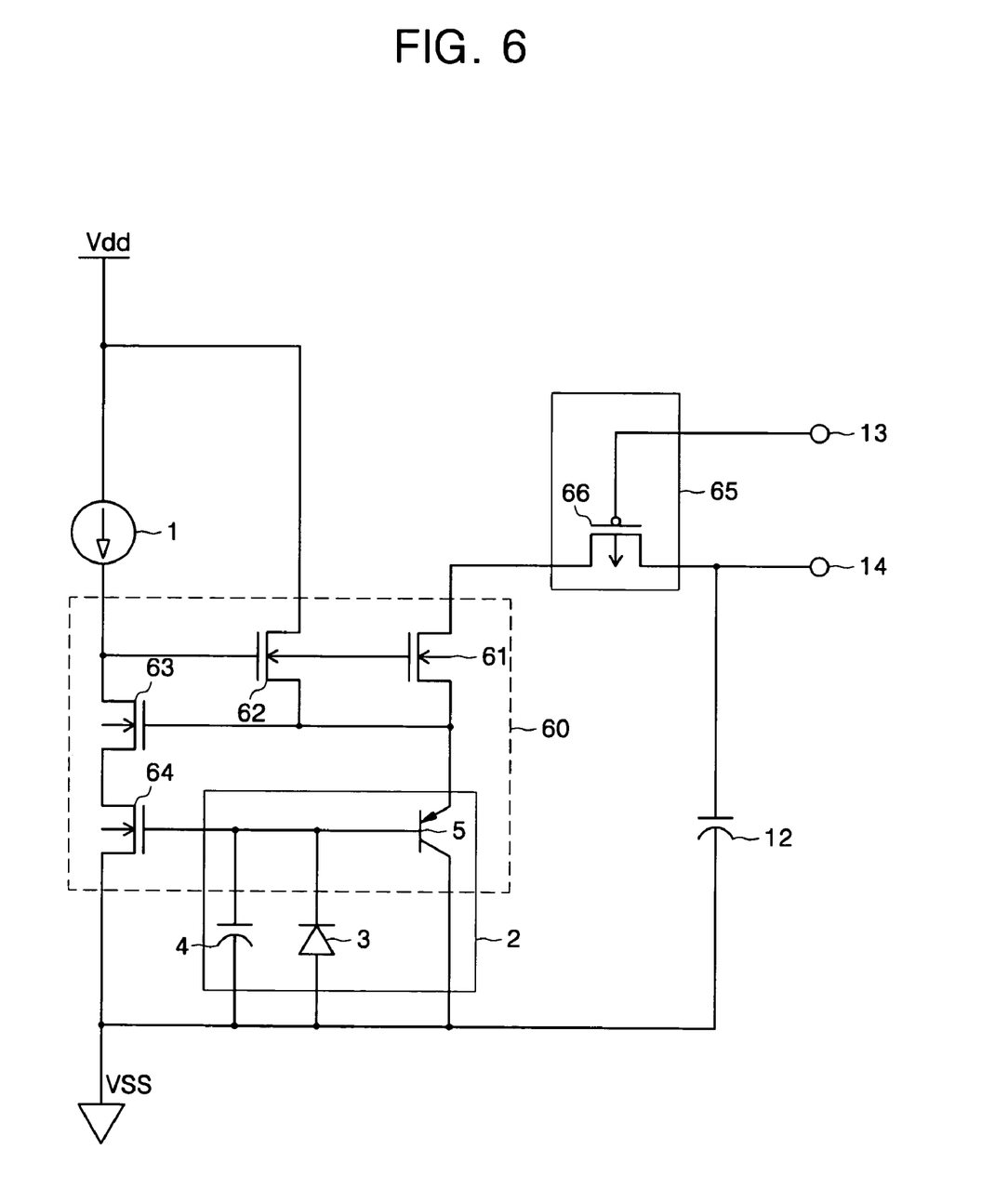
FIG. 6 is a diagram showing a photocurrent sensing circuit having a stabilized feedback loop according to a fifth embodiment of the present invention.

FIG. 6 is a diagram showing a photocurrent sensing circuit having a stabilized feedback loop according to a fifth embodiment of the present invention.

The photocurrent sensing circuit of FIG. 6 provides an increased gain of a feedback loop together with the stabilized feedback loop, and the simpler configuration of the photocurrent sensing circuit shown in FIG. 4 in order to allow a response time of the feedback loop to be reduced, and finally, to make the response properties of the photocurrent sensing circuit faster.

Like numbers refer to like elements for a circuit that has the same configuration and operation as in FIG. 2 so that the detailed description thereof will be omitted.

Still referring to FIG. 6, a feedback loop 60 of the photocurrent sensing circuit of the present invention further includes an NMOS transistor 63 that forms a cascode configuration with an NMOS transistor 64.

Here, impedance between a gate terminal of an NMOS transistor 62 and a drain terminal of the NMOS transistor 63 is increased. Therefore, a gain of the feedback loop 60 is also increased to more rapidly stabilize a base voltage of a PNP transistor 5 in the feedback loop 60.

Thus, with the cascode configuration, the photocurrent sensing circuit of FIG. 6 allows the response time of the feedback loop to be reduced, and finally, makes the response properties of the photocurrent sensing circuit faster, thereby transmitting an optical signal more efficiently.

Figure 7:
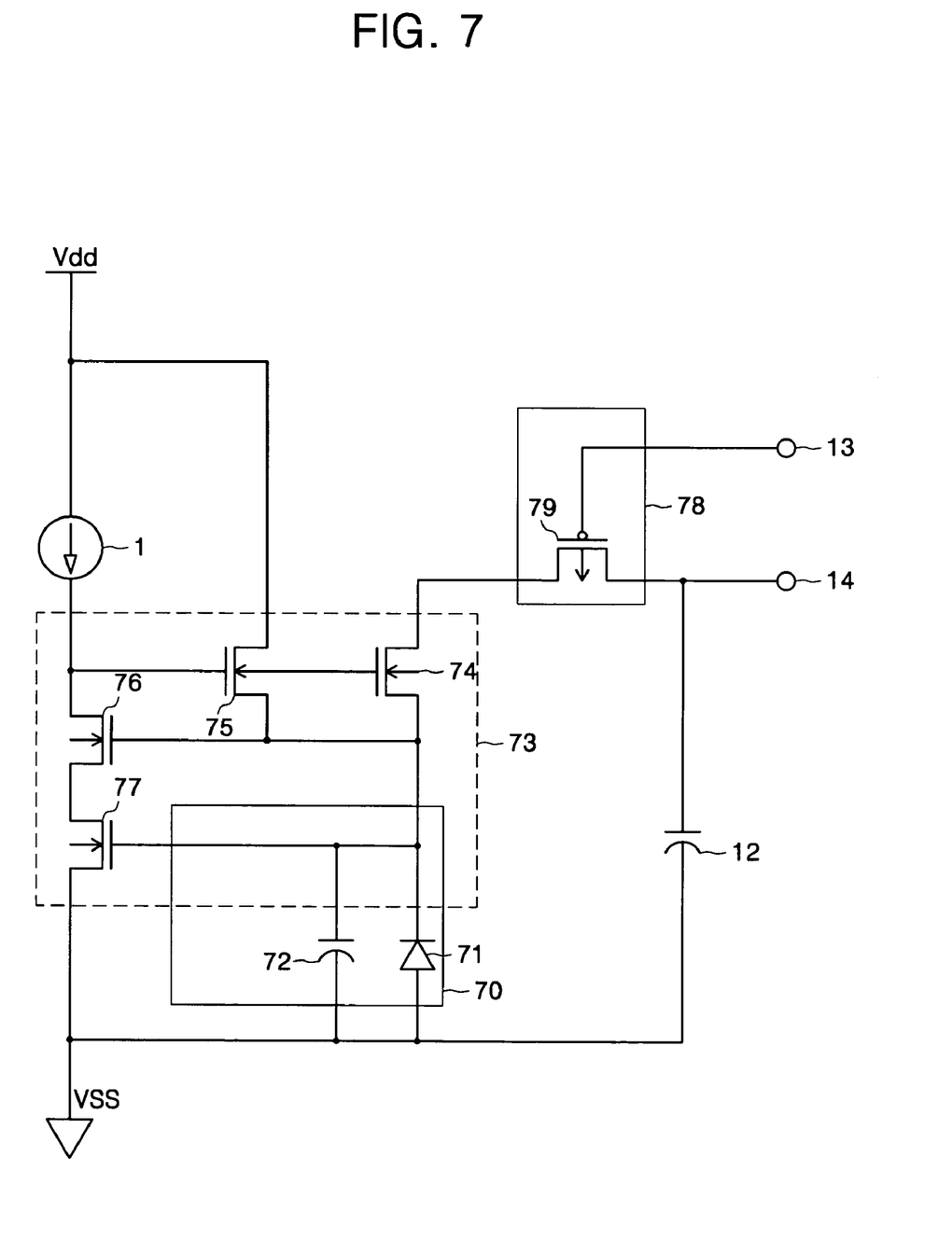
FIG. 7 is a diagram showing a photocurrent sensing circuit having a stabilized feedback loop according to a sixth embodiment of the present invention.

FIG. 7 is a diagram showing a photocurrent sensing circuit having a stabilized feedback loop according to a sixth embodiment of the present invention.

The photocurrent sensing circuit of FIG. 7 provides an increased gain of a feedback loop together with the stabilized feedback loop, the simpler circuit configuration, the wider operating voltage range and improved uniformity of the photocurrent sensing circuit shown in FIG. 5 in order to allow a response time of the feedback loop to be reduced, and finally, to make the response properties of the photocurrent sensing circuit more faster.

Like numbers refer to like elements for a circuit that has the same configuration and operation as in FIG. 2 so that the detailed description thereof will be omitted.

Still referring to FIG. 7, a feedback loop 73 of the photocurrent sensing circuit of the present invention further includes an NMOS transistor 76 that forms a cascode configuration with an NMOS transistor 77.

Here, impedance between a gate terminal of an NMOS transistor 75 and a drain terminal of the NMOS transistor 76 is increased. Therefore, a gain of the feedback loop 73 is also increased to more rapidly stabilize a cathode voltage of a photodiode 71 in the feedback loop 70.

Thus, with the cascode configuration, the photocurrent sensing circuit of FIG. 7 allows the response time of the feedback loop to be reduced, and finally, makes the response properties of the photocurrent sensing circuit faster, thereby transmitting an optical signal more efficiently.

As described above, according to the photocurrent sensing circuit of the present invention, the feedback loop is not affected by the output control signal of the output control unit and is always stably maintained, so that reliability may be enhanced.

Further, by forming the photocurrent sensing circuit with only transistors to be less affected by the process variation, uniformity of the photocurrent sensing circuit may be improved and a wide range of operating voltage may also be provided to increase the signal conversion performance of the photocurrent sensing circuit.

Further, the photocurrent sensing circuit may have faster response properties by providing the feedback loop having the high gain.

While the present invention has been described in connection with an exemplary embodiment, those skilled in the art will appreciate that a variety of modifications and changes may be made without departing from the spirit and scope of the present invention, claimed in the following appended claims.

What is claimed is:

1. A photocurrent sensing circuit having a stabilized feedback loop, the circuit comprising:
    a photocurrent generator including a photodiode generating the photocurrent in proportion to an amount of incident light and applying the photocurrent to an output node;
    a switching unit applying the photocurrent applied to a control node to a voltage-generating capacitor when a shutter signal is in a first state, and applying a predetermined current to the control node when the shutter signal is in a second state; and
    a circuit stabilizer applying the photocurrent applied to the output node to the control node, and always forming a feedback loop of the photodiode through the photocurrent applied to the output node,
    wherein the circuit stabilizer comprises:
    a first NMOS transistor forming the feedback loop of the photodiode in response to the photocurrent input to the output node when the predetermined current is applied to the control node, breaking the feedback loop and applying the photocurrent applied to the output node to the control node when the predetermined current is not applied to the control node;
    a second NMOS transistor always forming the feedback loop of the photodiode in response to the photocurrent applied to the output node; and
    a third NMOS transistor connected to the first and second transistors and the photodiode, and providing a current path for forming the feedback loop.

2. The photocurrent sensing circuit having a stabilized feedback loop of claim 1, wherein the photocurrent generator further comprises a PNP transistor having a base node connected to a cathode of the photodiode, an emitter node connected to the output node, and a contact node connected to a ground voltage, the PNP transistor amplifying the photocurrent applied to the base node and outputting it to the emitter node, and
    the first NMOS transistor to the third NMOS transistor continuously form the feedback loop through the cathode of the photodiode, the base node of the PNP transistor, and the emitter node of the PNP transistor.

3. The photocurrent sensing circuit having a stabilized feedback loop of claim 1, wherein the switching unit comprises at least one MOS transistor transferring the photocurrent to the voltage-generating capacitor when the shutter signal is in the first state, and generating the predetermined current in response to a power voltage and applying it to the control node when the shutter signal is in the second state.

4. The photocurrent sensing circuit having a stabilized feedback loop of claim 1, wherein the first NMOS transistor has a drain node connected to the control node, a source node connected to the output node, and a gate node connected to a gate node of the second NMOS transistor;
    the second NMOS transistor has a drain node connected to the power voltage, a source node connected to the output node, and a gate node connected to the gate node of the first NMOS transistor; and
    the third NMOS transistor has a drain node connected to the gate nodes of the first and the second NMOS transistors, a source node connected to the ground voltage and a gate node is connected to the cathode of the photodiode.

5. The photocurrent sensing circuit having a stabilized feedback loop of claim 4, wherein the circuit stabilizer further comprises a fourth NMOS transistor having a drain node connected to the gate nodes of the first and second NMOS transistors, a source node connected to the drain node of the third NMOS transistor, and a gate node connected to the source nodes of the first and second NMOS transistors,
    and gain of the feedback loop is increased by a impedance of the fourth NMOS transistor to stabilize the cathode voltage of the photodiode more faster.

* * * * *